United States Patent
Park et al.

(10) Patent No.: US 12,471,365 B1
(45) Date of Patent: Nov. 11, 2025

(54) SEMICONDUCTOR DEVICE INCLUDING BOTTOM ISOLATION STRUCTURE FOR PREVENTING CURRENT LEAKAGE

(71) Applicant: SAMSUNG ELECTRONICS CO., LTD., Suwon-si (KR)

(72) Inventors: Keumseok Park, Slingerlands, NY (US); Edward Namkyu Cho, Albany, NY (US); Kang-ill Seo, Springfield, VA (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/900,000

(22) Filed: Sep. 27, 2024

Related U.S. Application Data

(60) Provisional application No. 63/644,166, filed on May 8, 2024.

(51) Int. Cl.
| | |
|---|---|
| H10D 30/01 | (2025.01) |
| H10D 30/43 | (2025.01) |
| H10D 30/67 | (2025.01) |
| H10D 62/10 | (2025.01) |
| H10D 64/01 | (2025.01) |
| H10D 84/01 | (2025.01) |
| H10D 84/03 | (2025.01) |
| H10D 84/85 | (2025.01) |
| H10D 88/00 | (2025.01) |

(52) U.S. Cl.
CPC ......... *H10D 84/856* (2025.01); *H10D 30/014* (2025.01); *H10D 30/43* (2025.01); *H10D 30/6735* (2025.01); *H10D 30/6757* (2025.01); *H10D 62/121* (2025.01); *H10D 64/017* (2025.01); *H10D 64/018* (2025.01); *H10D 84/0188* (2025.01); *H10D 84/038* (2025.01); *H10D 88/01* (2025.01)

(58) Field of Classification Search
CPC ............ H10D 30/014; H10D 30/6757; H10D 62/121; H10D 64/018; H10D 64/017; H10D 30/6735; H10D 30/43
See application file for complete search history.

(56) References Cited

U.S. PATENT DOCUMENTS

| | | | |
|---|---|---|---|
| 11,785,760 B2 | 10/2023 | Chou | |
| 11,923,363 B2 | 3/2024 | Frougier et al. | |
| 2023/0086633 A1* | 3/2023 | Frougier | H10D 62/118 |
| | | | 257/369 |
| 2023/0290776 A1 | 9/2023 | Mochizuki et al. | |
| 2023/0395600 A1 | 12/2023 | Xie et al. | |
| 2024/0047524 A1* | 2/2024 | Kang | H10D 30/014 |
| 2024/0145578 A1 | 5/2024 | Vega et al. | |

\* cited by examiner

*Primary Examiner* — Mohammad M Choudhry
(74) *Attorney, Agent, or Firm* — Myers Bigel, P.A.

(57) ABSTRACT

Provided is a semiconductor device which includes: a substrate; a channel structure on the substrate; a source/drain pattern connected to the channel structure; a gate structure on the channel structure; an inner spacer structure comprising an inner spacer between the source/drain pattern and the gate structure, and an inner spacer residue connected to the inner spacer structure; and an inner isolation structure between the inner spacer residue and a bottom surface of the source/drain pattern.

15 Claims, 13 Drawing Sheets

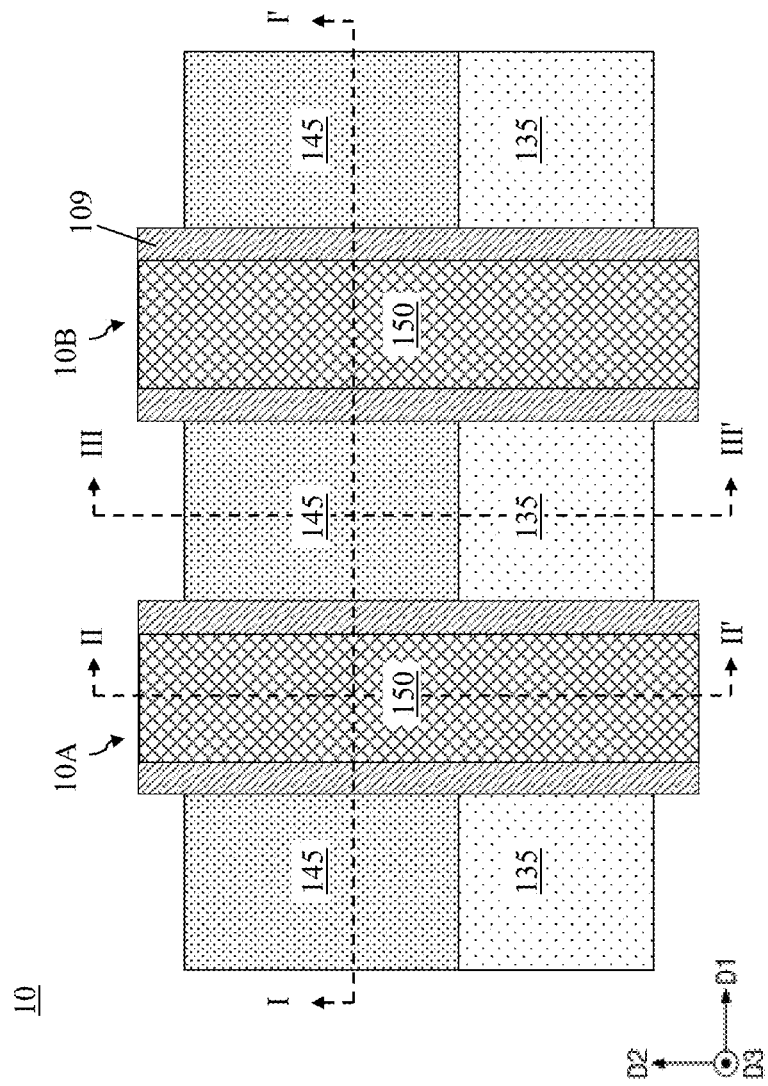

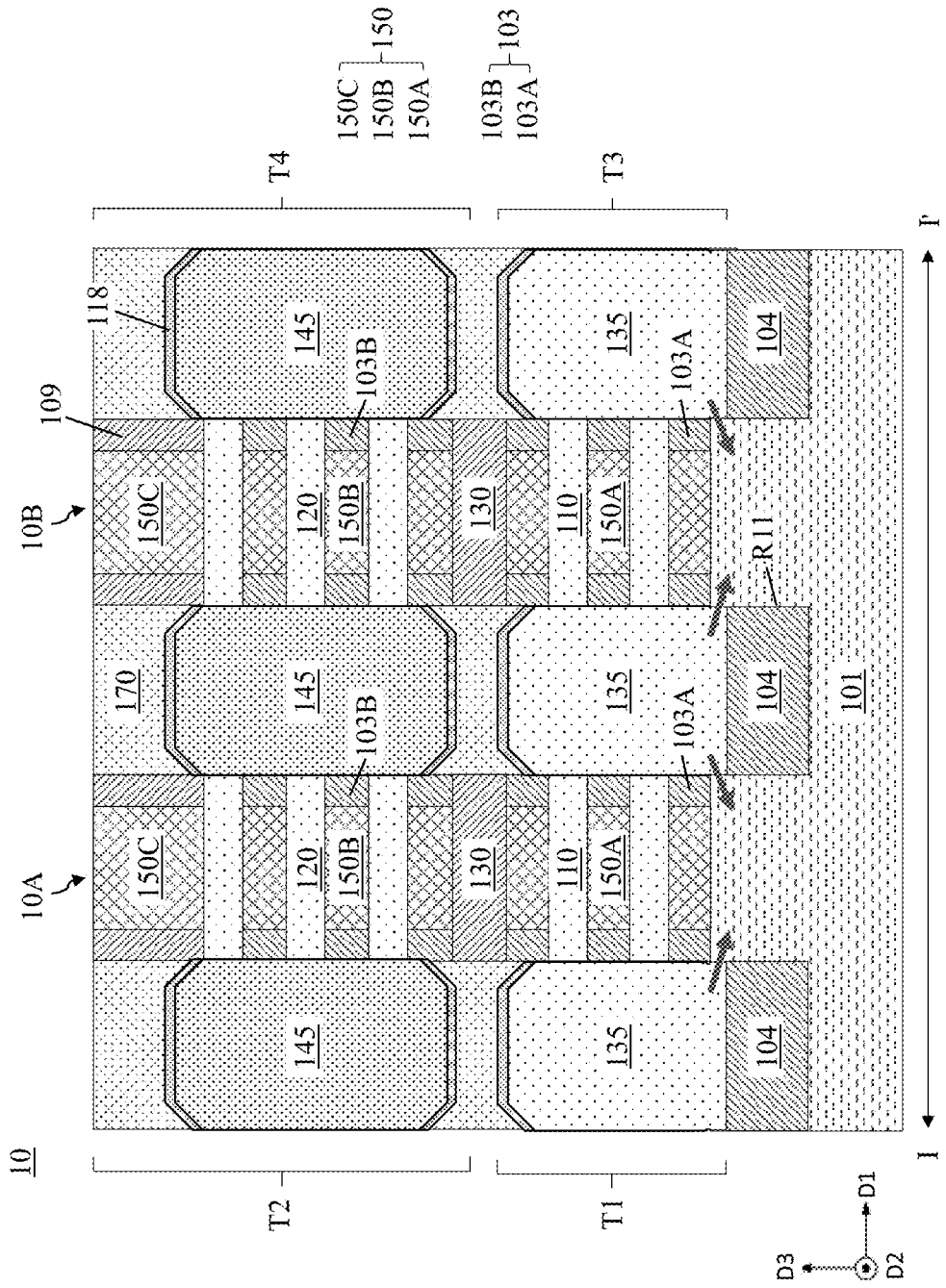

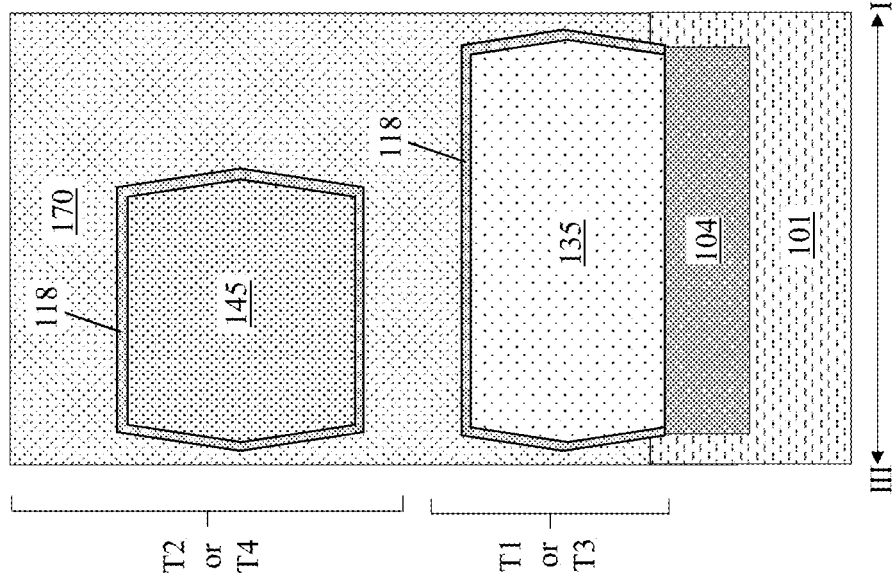
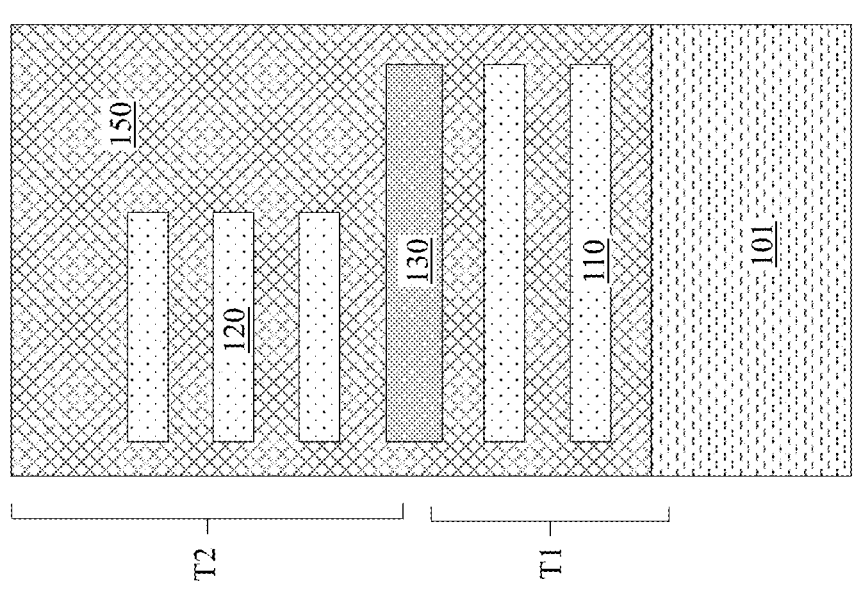

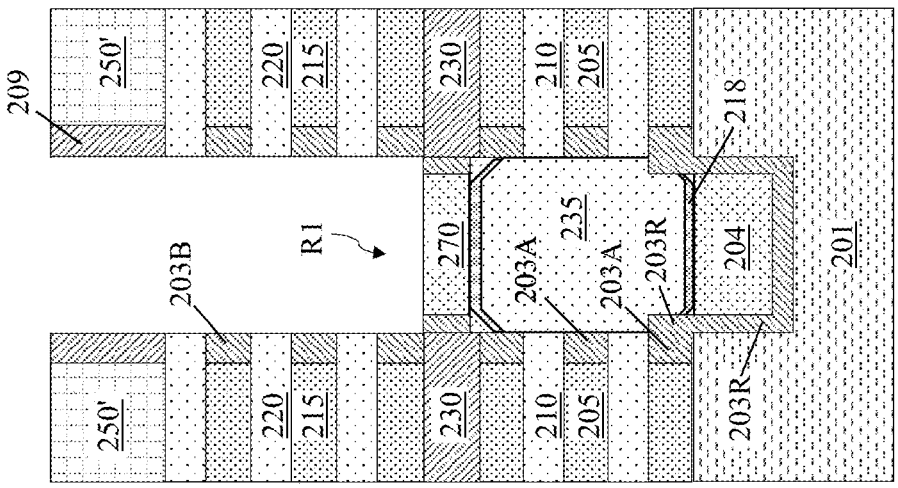
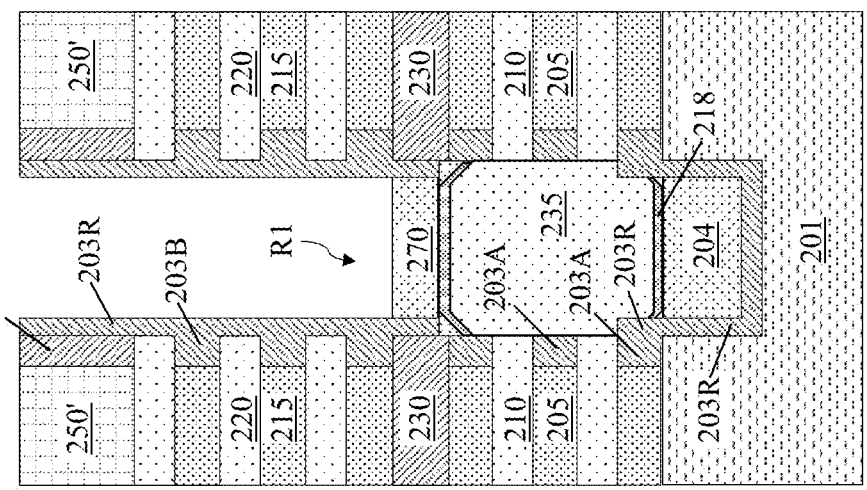

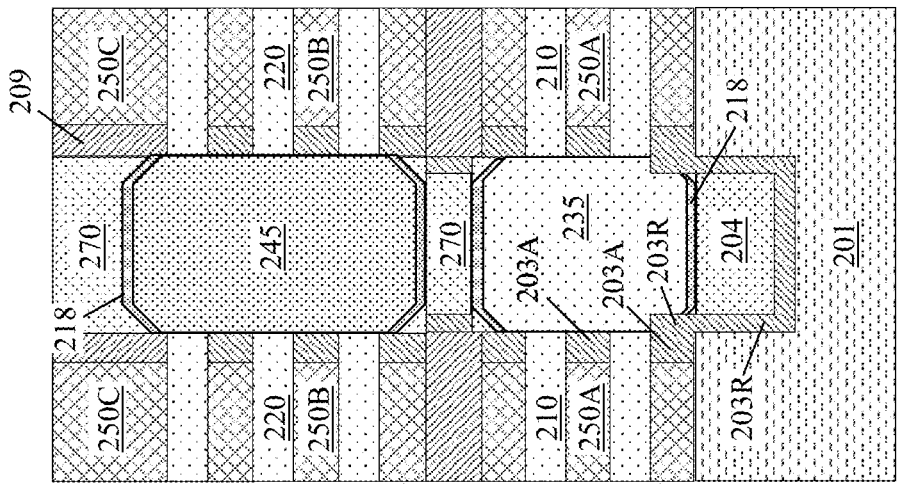
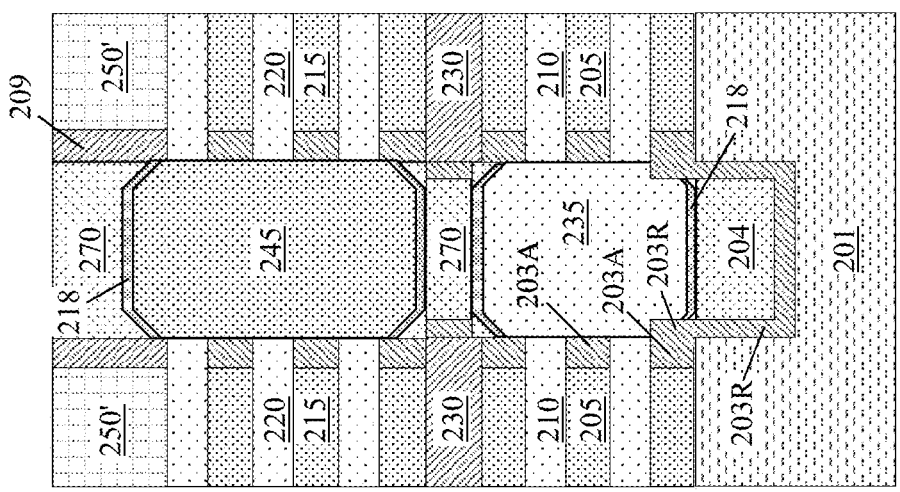

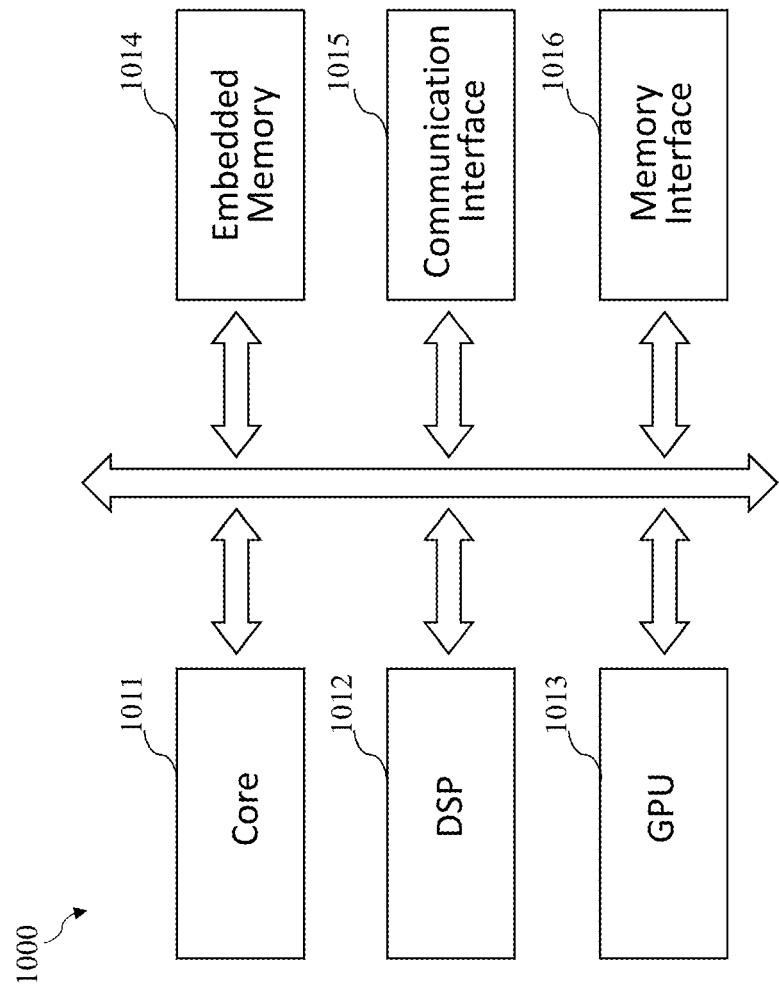

SEMICONDUCTOR DEVICE INCLUDING BOTTOM ISOLATION STRUCTURE FOR PREVENTING CURRENT LEAKAGE

CROSS-REFERENCE TO RELATED APPLICATION

This application is based on and claims priority from U.S. Provisional Application No. 63/644,166 filed on May 8, 2024 in the U.S. Patent and Trademark Office, the disclosure of which is incorporated herein in its entirety by reference.

BACKGROUND

1. Field

Apparatuses and methods consistent with the disclosure relate to a semiconductor device such as three-dimensionally stacked (3D-stacked) semiconductor device in which an inner spacer residue preventing current leakage from a source/drain pattern is formed.

2. Description of Related Art

A 3D-stacked semiconductor device has been introduced in a response to increased demand for an integrated circuit having a high device density and performance. The 3D-stacked semiconductor device may include a $1^{st}$ transistor at a $1^{st}$ level and a $2^{nd}$ transistor at a $2^{nd}$ level above the $1^{st}$ level, where each of the two transistors may be a fin field-effect transistor (FinFET), a nanosheet transistor, a forksheet transistor, or any other type of transistor.

The FinFET has one or more horizontally arranged vertical fin structures as a channel structure of which at least three surfaces are surrounded by a gate structure, and the nanosheet transistor is characterized by one or more nanosheet channel layers, which are vertically stacked or arranged on a substrate, as a channel structure and a gate structure surrounding all four surfaces of each of the nanosheet channel layers. The nanosheet transistor is referred to as gate-all-around (GAA) transistor, or as a multi-bridge channel field-effect transistor (MBCFET). The forksheet transistor is a combination of two nanosheet transistors with an insulation backbone structure therebetween. Nanosheet channel layers of each nanosheet transistor are formed at each side of the insulation backbone structure and pass through a gate structure in parallel with the backbone structure.

With device density increases to implement the 3D-stacked semiconductor device, an aspect ratio allowed for the formation of channel structures, source/drain patterns, and gate structures in the 3D-stacked semiconductor device also increases. Further, a reduced contact-poly-pitch (CPP) and a decreased cell height along with the high aspect ratio present greater challenges in improving performance of the 3D-stacked semiconductor device and a production yield thereof because of a very small process margin, a short-circuit risk, capacitance increase between these front-end-of-line (FEOL) elements, etc. in the 3D-stacked semiconductor device.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

According to an aspect of the disclosure, there is provided a semiconductor device which may include: a substrate; a channel structure on the substrate; a source/drain pattern connected to the channel structure; a gate structure on the channel structure; an inner spacer structure comprising an inner spacer between the source/drain pattern and the gate structure, and an inner spacer residue connected to the inner spacer structure; and an inner isolation structure between the inner spacer residue and a bottom surface of the source/drain pattern.

According to an aspect of the disclosure, the inner spacer and the inner spacer residue include a same material composition, and the inner spacer residue and the inner isolation structure have different material compositions.

According to an aspect of the disclosure, there is provided a semiconductor device which may include: a substrate; a $1^{st}$ channel structure and a $2^{nd}$ channel structure at a side of the $1^{st}$ channel structure, on the substrate; a source/drain pattern between the $1^{st}$ channel structure and the $2^{nd}$ channel structure; a $1^{st}$ gate structure on the $1^{st}$ channel structure, and a $2^{nd}$ gate structure on the $2^{nd}$ channel structure; a $1^{st}$ inner spacer between the source/drain pattern and the $1^{st}$ gate structure, and a $2^{nd}$ inner spacer between the source/drain pattern and the $2^{nd}$ gate structure; and an inner spacer residue connecting the $1^{st}$ inner spacer and the $2^{nd}$ inner spacer, wherein the $1^{st}$ inner spacer is connected to the $2^{nd}$ inner spacer through the inner spacer residue in the substrate below the source/drain pattern.

According to an aspect of the disclosure, there is provided a method of manufacturing a semiconductor device, which may include: forming a channel structure on a substrate; forming a bottom recess in a substrate, at a side of the channel structure; forming an inner spacer layer such that an inner spacer is formed at a side of the channel structure and extended into the bottom recess to form an inner spacer residue; forming an inner isolation structure on the inner spacer residue in the bottom recess; and forming a source/drain pattern from the channel structure such that the source/drain pattern is on the inner isolation structure in the bottom recess.

BRIEF DESCRIPTION OF DRAWINGS

Example embodiments of the disclosure will be more clearly understood from the following detailed description taken in conjunction with the accompanying drawings.

FIGS. 1A-1D illustrate a 3D-stacked semiconductor device in which a bottom isolation structure is discretely formed below a lower source/drain pattern, according to one or more embodiments.

FIG. 5 is a schematic block diagram illustrating an electronic device including a semiconductor device including a bottom isolation structure formed of at least two different layers, according to one or more embodiments.

DETAILED DESCRIPTION

Figure 2:
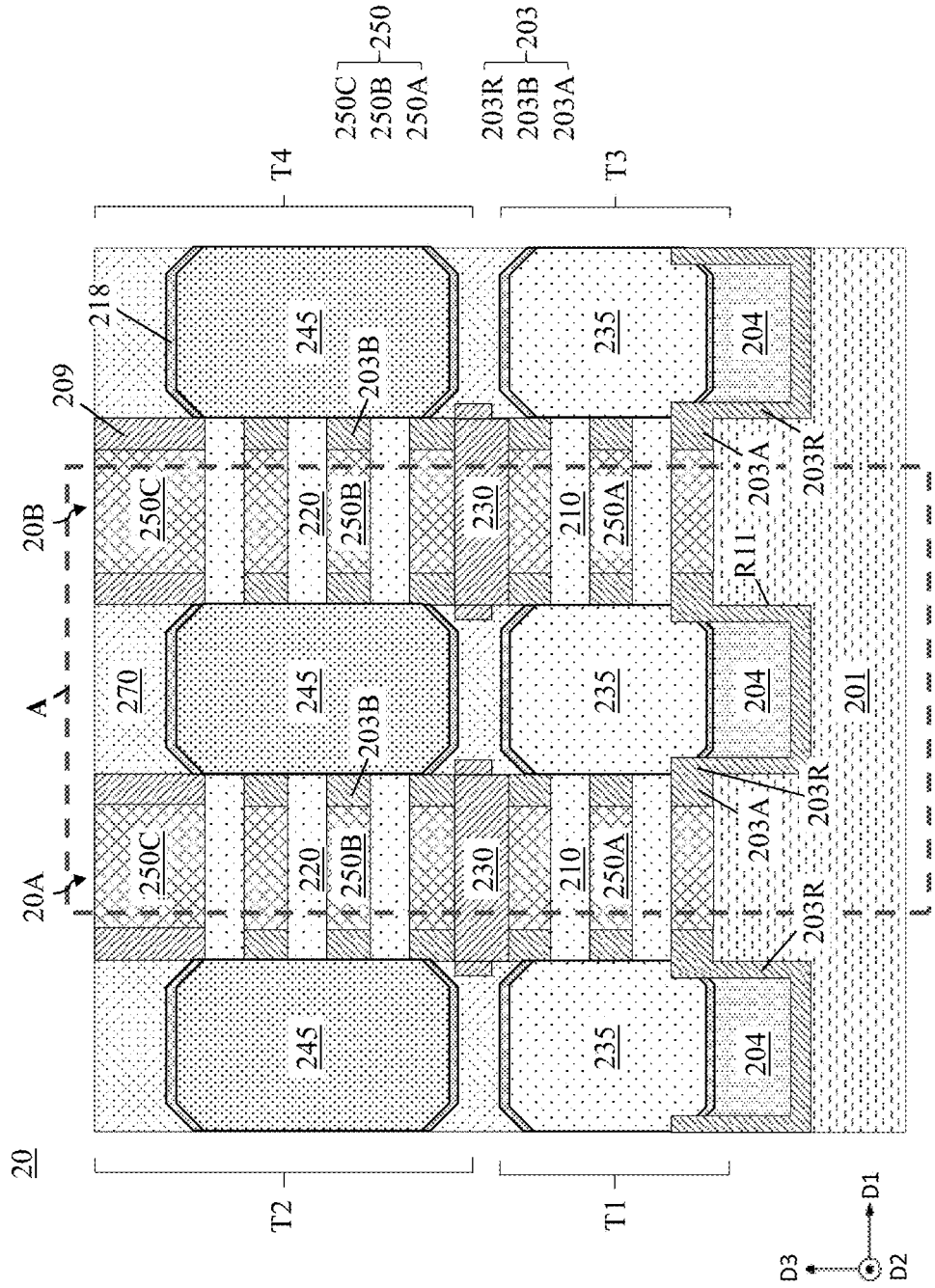
FIG. 2 illustrates a 3D-stacked semiconductor device including a bottom isolation structure formed of at least two different layers, according to one or more embodiments.

All of the embodiments of the disclosure described herein are example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, channel layers, sacrificial layers, and isolation layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element of the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, an element described as "below" or "beneath" another element would then be oriented "above" the other element. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "left" element and a "right" element" may be a "right" element and a "left" element when a device or structure including these elements are differently oriented. Thus, in the descriptions herebelow, the "left" element and the "right" element may also be referred to as a "$1^{st}$" element or a "$2^{nd}$" element, respectively, as long as their structural relationship is clearly understood in the context of the descriptions. Similarly, the terms a "lower" element and an "upper" element may be respectively referred to as a "$1^{st}$" element and a "$2^{nd}$" element with necessary descriptions to distinguish the two elements.

It will be understood that, although the terms "$1^{st}$," "$2^{nd}$," "$3^{rd}$," "$4^{th}$," "$5^{th}$," "$6^{th}$," etc. may be used herein to describe various elements, these elements should not be limited by these terms. These terms are only used to distinguish one element from another element. Thus, a $1^{st}$ element described in the descriptions of an embodiments could be termed a $2^{nd}$ element in the descriptions of another element or one or more claims, and vice versa without departing from the teachings of the disclosure.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" is used to compare a dimension of two or more elements, the term may cover a "substantially same" dimension.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. Various regions illustrated in the figures are schematic in nature and their shapes are not intended to illustrate the actual shape of a region of a device and are not intended to limit the scope of the disclosure. Further, in the drawings, the sizes and relative sizes of layers and regions may be exaggerated for clarity.

For the sake of brevity, conventional elements, structures or layers of semiconductor devices including a nanosheet transistor and materials forming the same may or may not be described in detail herein. For example, a certain isolation layer or structure of a semiconductor device and materials forming the same may be omitted herein when this layer or structure is not related to the novel features of the embodiments. Also, descriptions of materials forming well-known structural elements of a semiconductor device may be omitted herein when those materials are not relevant to the novel features of the embodiments. Herein, the term "isolation" pertains to electrical insulation or separation between structures, layers, components or regions in a corresponding device or structure.

FIGS. 1A-1D illustrate a 3D-stacked semiconductor device in which a bottom isolation structure is discretely formed below a lower source/drain pattern, according to one or more embodiments.

FIGS. 1B-1D are cross-section views of the 3D-stacked semiconductor device shown in FIG. 1A taken along lines I-I', II-II' and III-III', respectively. It is to be understood here that FIG. 1A is provided to show a positional relationship between gate structures and source/drain patterns, and thus, some structural elements such as isolation layers or structures shown in FIGS. 1B-1D are not omitted in FIG. 1A for brevity purposes.

As shown in FIG. 1A, a $1^{st}$ direction D1 is a channel-length direction in which a current flows between two source/drain patterns connected to each other through a channel structure, a $2^{nd}$ direction D2 is a channel-width direction or a cell-height direction that horizontally intersects the $1^{st}$ direction D1, and a $3^{rd}$ direction D3 is a channel-thickness direction that vertically intersects the $1^{st}$ direction D1 and the $2^{nd}$ direction D2.

Referring to FIGS. 1A-1D, a 3D-stacked semiconductor device 10 may include a $1^{st}$ channel stack 10A and a $2^{nd}$ channel stack 10B each of which includes a plurality of $1^{st}$ channel layers 110 and a plurality of $2^{nd}$ channel layers 120 on the $1^{st}$ channel layers. The $1^{st}$ channel layers 110 may be formed at a $1^{st}$ level on a substrate 101, and the $2^{nd}$ channel layers 120 may be formed at a $2^{nd}$ level above the $1^{st}$ level. A middle isolation layer 130 may be formed between the uppermost channel layer among the $1^{st}$ channel layers 110 and the lowermost channel layer among the $2^{nd}$ channel layers 120. These channel layer 110 and 120 may have been epitaxially grown from a substrate 101.

The $1^{st}$ channel layers 110 may connect $1^{st}$ source/drain patterns 135 at both sides thereof to each other so that a current flows therebetween at a control of a $1^{st}$ inner gate structure 150A which surrounds the $1^{st}$ channel layers 110. Similarly, the $2^{nd}$ channel layers 120 may connect $2^{nd}$ source/drain patterns 145 at both sides thereof to each other so that a current flows therebetween at a control of a $2^{nd}$ inner gate structure 150B which surrounds the $2^{nd}$ channel layers 120. The $1^{st}$ source/drain patterns 135 may be epitaxially grown from the $1^{st}$ channel layers 110 and the $2^{nd}$ source/drain patterns 145 may be epitaxially grown from the $2^{nd}$ channel layers 120. The $1^{st}$ inner gate structure 150A and the $2^{nd}$ inner gate structure 150B along with an outer gate structure 150C above the $2^{nd}$ inner gate structure 150B may form a gate structure 150 of the 3D-stacked semiconductor device 10.

Thus, in the 3D-stacked semiconductor device 10, the $1^{st}$ channel layers 110 in the $1^{st}$ channel stack 10A along with the $1^{st}$ source/drain patterns 135 at both sides thereof and the $1^{st}$ inner gate structure 150A surrounding these $1^{st}$ channel layers 110 may form a $1^{st}$ transistor T1, which is a nanosheet transistor, at the $1^{st}$ level. Further, the $2^{nd}$ channel layers 120 in the same $1^{st}$ channel stack 10A along with the $2^{nd}$ source/drain patterns 145 at both sides thereof and the $2^{nd}$ inner gate structure 150B surrounding these $2^{nd}$ channel layers 120 may form a $2^{nd}$ transistor T2, which is also a nanosheet transistor, at the $2^{nd}$ level. Similarly, the $1^{st}$ channel layers 110 in the $2^{nd}$ channel stack 10B along with the $1^{st}$ source/drain patterns 135 at both sides thereof and a $1^{st}$ inner gate structure 150A surrounding these $1^{st}$ channel layers 110 may form a $3^{rd}$ transistor T3, which is a nanosheet transistor, at the $1^{st}$ level. Further, the $2^{nd}$ channel layers 120 in the same $2^{nd}$ channel stack 10B along with the $2^{nd}$ source/drain patterns 145 at both sides thereof and a $2^{nd}$ inner gate structure 150B surrounding these $2^{nd}$ channel layers 120 may form a $4^{th}$ transistor T4, which is also a nanosheet transistor, at the $2^{nd}$ level.

The substrate 101 may be a silicon (Si) substrate. Additionally, or alternatively, it may include other materials such as silicon germanium (SiGe), silicon carbide (SiC), not being limited thereto. The $1^{st}$ channel layers 110 and the $2^{nd}$ channel layers 120 may each be formed of silicon (Si) or silicon germanium (SiGe). The $1^{st}$ source/drain patterns 135 and the $2^{nd}$ source/drain patterns 145 may also be formed of Si or SiGe. However, when the $1^{st}$ source/drain patterns 135 are formed of Si and doped with n-type impurities such as phosphorus (P), arsenic (As), antimony (Sb), etc., the $1^{st}$ transistor T1 and the $3^{rd}$ transistor T3 may each be an n-type transistor. In contrast, when the $2^{nd}$ source/drain patterns 145 are formed of SiGe and doped with impurities such as boron (B), gallium (Ga), indium (In), etc., the $2^{nd}$ transistor T2 and the $4^{th}$ transistor T4 may each be a p-type transistor.

A front isolation structure 170 may be formed to surround the source/drain patterns 135 and 145 to isolate these semiconductor structures from each other and other circuit elements. The front isolation structure 170 may be formed of a low-k dielectric material such as silicon oxide (e.g., $SiO_2$). A protection layer 118 may be formed on a top surface of each of the $1^{st}$ source/drain patterns 135 and a bottom surface and a top surface of each of the $2^{nd}$ source/drain patterns 145 to protect these source/drain patterns from the front isolation structure 170.

As described above, the gate structure 150 may include the $1^{st}$ inner gate structure 150A, the $2^{nd}$ inner gate structure 150B and the outer gate structure 150C in each of the channel stacks 10A and 10B. Each of the inner gate structures 150A and 150B may be interposed between two adjacent channel layers 110 or 120 and between the lowermost $1^{st}$ channel layer 110 and the substrate 101. The outer gate structure 150C may be formed above the channel layers 110 and 120. It is to be understood herein that a lower portion of the outer gate structure 150C on the upper most $2^{nd}$ channel layer 120 may be a portion of the $2^{nd}$ inner gate structure 150B and a remaining portion of the outer gate structure 150C may form the gate electrode of the gate structure 150.

Further, the gate structure 150 may be formed of a gate dielectric layer, a work-function metal layer, and a gate electrode. The gate dielectric layer may be formed on each of the channel layers 110 and 120, and include an interfacial layer formed of an oxide material such as silicon oxide (e.g., SiO, $SiO_2$, etc.) and/or silicon oxynitride (e.g., SiON), not being limited thereto. The gate dielectric layer may also include a high-k layer formed of a high-k material such as hafnium (Hf), aluminum (Al), zirconium (Zr), lanthanum (La), magnesium (Mg), barium (Ba), titanium (Ti), lead (Pb), and/or a combination thereof, not being limited thereto. The work-function metal layer may be formed on the gate dielectric layer and include of a metal such as copper (Cu), Al, Ti, tantalum (Ta), tungsten (W), cobalt (Co), TiN, WN, TiAl, TiAlN, TaN, TiC, TaC, TiAlC, TaCN, TaSiN, and/or a combination thereof, not being limited thereto. However, the work-function metal layers of the gate structure 150 may be different from each other in the case where the $1^{st}$ and $3^{rd}$ transistors T1 and T3 are of an n-type and the $2^{nd}$ and $4^{th}$ transistors T2 and T4 are of a p-type so that they may have different gate threshold voltages. The gate electrode may be formed on the work-function metal layers, and include a metal material such as Cu, W, Al, Co, and/or a combination thereof, not being limited thereto.

The gate structure 150 on each of the channel stacks 10A and 10B may be a common gate structure shared by the two transistors T1 and T2 (or T3 and T4) to form a complementary metal oxide semiconductor (CMOS) device structure such as an inverter circuit, not being limited thereto. However, the disclosure is not limited thereto, an additional isolation layer or structure may be formed to separate and isolate the gate structure 150 into two gate structures for the respective two transistors T1 and T2 (or T3 and T4). For example, a gate electrode on the $1^{st}$ inner gate structure 150A may be isolated from a gate electrode on the $2^{nd}$ inner gate structure 150B and the outer gate structure 150C.

A gate spacer 109 may be formed on side surfaces of an upper portion of the gate structure 150 in each of the channel stacks 10A and 10B. The gate spacers 109 may have been used to protect a dummy gate structure formed of polycrystalline silicon (p-Si) or amorphous silicon (a-Si) from various processes in manufacturing the 3D-stacked semiconductor device 10, and remain after the dummy gate structure is replaced by the gate structure 150 to prevent current leakage therefrom to other circuit elements. The gate spacer 109 may be formed of silicon oxide or silicon nitride (e.g., $SiO_2$, SiN, $Si_3N_4$, SiBCN, SiCN, SiOC, SiOCN, etc.), not being limited thereto.

It is to be understood here that, although FIGS. 1A-1D show only two channel stacks 10A and 10B in the 3D-stacked semiconductor device 10, one or more additional channel stacks having the same structure as each of the two channel stacks 10A and 10B may be arranged at a left side of the $1^{st}$ channel stack 10A and/or a right side of the $2^{nd}$ channel stack 10B in the $1^{st}$ direction D1. Further, additional source/drain patterns may be epitaxially grown based on these channel stacks to form additional nanosheet transistors of the 3D-stacked semiconductor device 10. In addition, although the 3D-stacked semiconductor device 10 has two $1^{st}$ channel layers 110 and three $2^{nd}$ channel layer 120 in each of the channel stacks 10A and 10B, the number of channel layers may not be limited thereto, according to one or more other embodiments.

Referring to FIGS. 1C and 1D, the $2^{nd}$ channel layers 120 may be formed to have a smaller width than the $1^{st}$ channel layers 110, in the D2 direction. Thus, the $2^{nd}$ source/drain patterns 145 epitaxially grown from the $2^{nd}$ channel layers 120 may also be formed to have a smaller width than the $1^{st}$ source/drain patterns 135 epitaxially grown from the $1^{st}$ channel layers 110, in the D2 direction. This width difference provides a space above a top surface of each of the $1^{st}$ source/drain patterns 135 which is not vertically overlapped by the $2^{nd}$ source/drain pattern 145 so that a source/drain pattern contact structure may be formed through this space.

An inner spacer structure 103 including a plurality of inner spacers formed at each side of the $1^{st}$ inner gate structure 150A and the $2^{nd}$ inner gate structure 150B may be provided in each of the channel stacks 10A and 10B to isolate these gate structures from the source/drain patterns 135 and 145. Herein, the inner spacers at each side of the $1^{st}$ inner gate structure 150A are referred to as $1^{st}$ inner spacers 103A, and the inner spacers 103 at each side of the $2^{nd}$ inner spacers 103B are referred to as $2^{nd}$ inner spacers 103B. The inner spacers 103A and 103B may each be formed of a material such as silicon nitride or a composite thereof (e.g., SiN, $Si_3N_4$, SiBCN, SiCN, SiOC, SiOCN, etc.), not being limited thereto, which may be different from the material(s) forming the gate spacer 109. Further, a bottom isolation structure 104 may be formed in a bottom recess below each of the $1^{st}$ source/drain patterns 135 to prevent current leakage from the $1^{st}$ source/drain pattern 135 to the substrate 101 which is formed of a semiconductor material such as silicon (Si).

In a manufacturing process of the 3D-stacked semiconductor device 10, the inner spacers 103A, 103B and the bottom isolation structure 104 may be formed at the same or substantially same time through the same deposition. Thus, the bottom isolation structure 104 may be formed of the same material as the inner spacers 103A and 103B, and connected to the lowermost $1^{st}$ inner spacer 103A among the $1^{st}$ inner spacers 103A to thereby prevent current leakage from the $1^{st}$ source/drain pattern 135 to the substrate 101. However, because of a dense CPP (gate pitch), a high aspect ratio, a very little manufacturing process margin, etc., the bottom isolation structure 104 and the lowermost $1^{st}$ inner spacer 103A may be disconnectedly formed, and thus, a current leakage path may be formed as shown in a direction shown by a solid arrow in FIG. 1B. Thus, the 3D-stacked semiconductor device 10 may have a degraded device performance.

The following embodiments address the foregoing issues caused by the disconnection between the lowermost inner spacer 103A and the bottom isolation structure 104.

FIG. 2 illustrates a 3D-stacked semiconductor device including a bottom isolation structure formed of at least two different layers, according to one or more embodiments.

Referring to FIG. 2, a 3D-stacked semiconductor device 20 may include the same or similar structural elements forming the 3D-stacked semiconductor device 10 shown in FIGS. 1A-1D except $1^{st}$ inner spacers 203A and a bottom isolation structure which are respectively different from the $1^{st}$ inner spacers 103A and the bottom isolation structure 104 of the 3D-stacked semiconductor device 10.

For example, the 3D-stacked semiconductor device 20 of FIG. 2 may include a substrate 201, channel stacks 20A and 20B, channel layers 210 and 220, a gate structure 250 including a $1^{st}$ inner gate structure 250A, a $2^{nd}$ inner gate structure 250B and an outer gate structure 250C, a gate spacer 209, source/drain patterns 235 and 245, a middle isolation layer 230, $2^{nd}$ inner spacers 203B, and a front isolation structure 270, which are respectively the same as or similar to the substrate 101, the channel stacks 10A and 10B, the channel layers 110 and 120, the gate structure 150 including the $1^{st}$ inner gate structure 150A, the $2^{nd}$ inner gate structure 150B and the outer gate structure 150C, the gate spacer 109, the source/drain patterns 135 and 145, the middle isolation layer 130, the $2^{nd}$ inner spacers 103B, and the front isolation structure 170. Thus, while duplicate descriptions thereof may be omitted, different aspects of the 3D-stacked semiconductor device 20 including the bottom isolation structure may be described herein.

The bottom isolation structure of the 3D-stacked semiconductor device 20 may include an inner spacer residue 203R and an inner isolation structure 204 formed on or contained in the inner spacer residue 203R. Similar to the bottom isolation structure 104 of the 3D-stacked semiconductor device 10, the bottom isolation structure of the 3D-stacked semiconductor device 20 which includes the inner spacer residue 203R and the inner isolation structure 204 may also be formed in a bottom recess R11 formed below each of the $1^{st}$ source/drain patterns 235 to prevent current leakage from the $1^{st}$ source/drain pattern 235 to the substrate 201. However, the bottom isolation structure of the 3D-stacked semiconductor device 20 may have a different structural shape from the bottom isolation structure 104 of the 3D-stacked semiconductor device 10. For example, the inner spacer residue 203R may be conformally formed along the bottom recess R11 and extended to contact side surfaces of the lowermost $1^{st}$ inner spacers 203A formed on two adjacent $1^{st}$ inner gate structures 250A and facing the same $1^{st}$ source/drain pattern 235.

As will be described later in reference to FIGS. 3A-3N, the inner spacer residue 203R may be a residual structure of the inner spacers 203 which remains after the formation of the inner spacers 203 from an inner spacer layer is completed in a process of manufacturing the 3D-stacked semiconductor device 20. The inner spacers 203 and the inner spacer residue 203R may have been formed at the same or substantially same time through the same deposition, and thus, the inner spacer residue 203R may be formed of the same material or material composition as the inner spacers 203. For example, the inner spacer residue 203R may be formed of silicon nitride or a composite thereof (e.g., SiN, Si$_3$N$_4$, SiBCN, SiCN, SiOC, SiOCN, etc.), not being limited thereto. Further, the lowermost 1$^{st}$ inner spacers 203A, formed on two adjacent 1$^{st}$ inner gate structures 250A and facing the same 1$^{st}$ source/drain pattern 235, and the inner spacer residue 203R connected thereto are a single continuum structure without a connection surface, interface or barrier therebetween.

In the meantime, unlike the bottom isolation structure 104 of the 3D-stacked semiconductor device 10, the inner spacer residue 203R may be formed to be not disconnected from the respective lowermost 1$^{st}$ inner spacers 203A of the channel stacks 20A and 20B. Further, the inner isolation structure 204 may be formed on or contained in the inner spacer residue 203R. The inner isolation structure 204 may be formed of a low-k dielectric material such as silicon oxide (e.g., SiO$_2$), not being limited thereto, having etch selectivity against silicon nitride or a composite thereof forming the inner spacers 203 and the inner spacer residue 203R. Thus, the bottom isolation structure 204 of the 3D-stacked semiconductor device 20 may include two different layers which may prevent or reduce current leakage from the 1$^{st}$ source/drain patterns 235 to the substrate 201 in a more effectively at least in comparison with the 3D-stacked semiconductor device 10 including the bottom isolation structure 104. Although not shown in FIG. 2, an additional nitride layer and an additional oxide layer may be formed on the inner isolation structure 204 for additional prevention of current leakage.

Figure 3A:
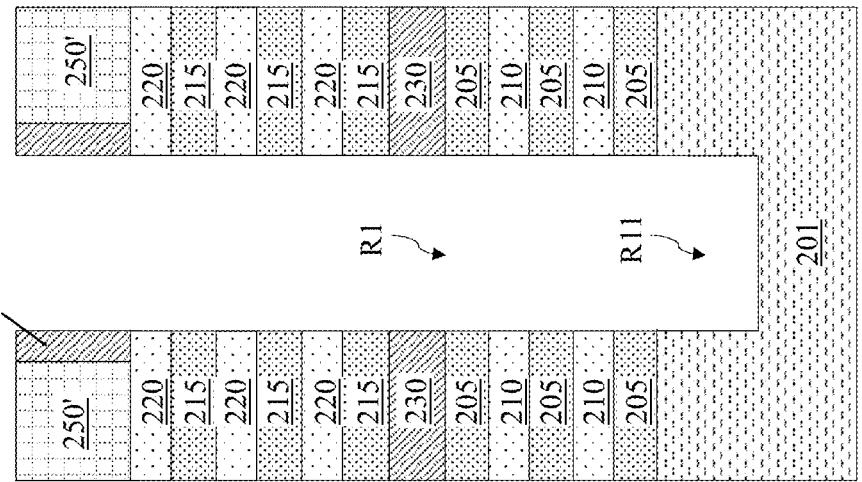
FIGS. 3A-3N illustrate cross-section views of intermediate semiconductor devices after respective steps of manufacturing a 3D-stacked semiconductor device including a bottom isolation structure formed of at least two different layers, according to one or more embodiments.

Herebelow, a method of manufacturing a 3D-stacked semiconductor device corresponding to the 3D-stacked semiconductor device 20 of FIG. 2 is provided in reference to FIGS. 3A-3N.

FIGS. 3A-3N illustrate cross-section views of intermediate semiconductor devices after respective steps of manufacturing a 3D-stacked semiconductor device including a bottom isolation structure formed of at least two different layers, according to one or more embodiments.

The 3D-stacked semiconductor device manufactured through the steps described in reference to FIGS. 3A-3N may be or correspond to the 3D-stacked semiconductor device 20 shown in FIG. 2. Thus, materials, functions, and structural characteristics of the intermediate semiconductor devices shown in FIGS. 3A-3N may be the same as or similar to those of the 3D-stacked semiconductor device 20 of FIG. 2, and thus, duplicate descriptions may be omitted herein while the same reference characters or numerals used in reference to FIG. 2 may be used herebelow. It is also to be understood here that the cross-section views of FIGS. 3A-3N correspond to a portion A of the 3D-stacked semiconductor device 20 indicated by a dashed line shown in FIG. 2.

Referring to FIG. 3A, an initial channel stack may be formed by epitaxially growing a plurality of semiconductor layers one by one from the substrate 201. Further, a plurality of dummy gate structures 250' may be disposed on the initial channel stack to form an intermediate semiconductor device 20'.

The initial channel stack formed on the substrate 201 may include 1$^{st}$ sacrificial layers 205 and 1$^{st}$ channel layers 210 vertically stacked or arranged in an alternating manner at a 1$^{st}$ level. On the uppermost 1$^{st}$ channel layer 210 may be formed a middle isolation layer 230, on which 2$^{nd}$ sacrificial layers 215 and 2$^{nd}$ channel layers 220 are vertically stacked or arranged in an alternating manner at a 2$^{nd}$ level.

The 1$^{st}$ sacrificial layers 205 and the 2$^{nd}$ sacrificial layers 215 may be formed of silicon germanium (SiGe) while the 1$^{st}$ channel layers 210 and the 2$^{nd}$ channel layers 220 may be formed of silicon (Si). Here, the sacrificial layers 205 and 215 are referred to as such because these structural elements will be removed and replaced by other layers or structures in a later step (FIG. 3N) of manufacturing the 3D-stacked semiconductor device. The middle isolation layer 230 may be formed of silicon nitride or a composite thereof (e.g., SiBCN, Si$_3$N$_4$, SiCN, SiOCN, SiN, etc.), not being limited thereto. The middle isolation layer 230 may have been formed by replacing a middle sacrificial layer formed between the uppermost 1$^{st}$ sacrificial layer 205 and the lowermost 2$^{nd}$ sacrificial layer 215 after a plurality of semiconductor layers including the channel layers 210, 220, the sacrificial layers 205, 225 and the middle sacrificial layer were epitaxially grown the substrate 201.

Figure 3B:
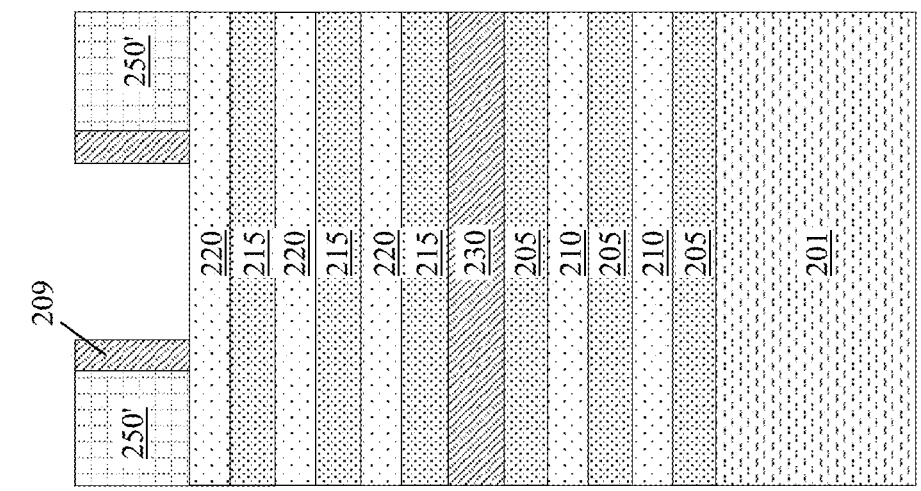

The dummy gate structures 250' and the gate spacers 209 may be formed on a top surface of the initial channel stack at positions below which each channel stack is to be formed in a next step (FIG. 3B). The dummy gate structures 250' may be formed by depositing polysilicon (p-Si) or amorphous silicon (a-Si) on the initial channel stack through, for example, physical vapor deposition (PVD), chemical vapor deposition (CVD), plasma enhanced chemical vapor deposition (PECVD), or a combination thereof, to form an initial dummy gate structure, and applying photolithography/masking/etching on initial dummy gate structure. Subsequently, the gate spacers 205 may be formed on side surfaces of each of the dummy gate structures 250' by depositing silicon oxide, silicon nitride or a composite thereof (e.g., SiO$_2$, SiN, Si$_3$N$_4$, SiBCN, SiCN, SiOC, SiOCN, etc.) through, for example, atomic layer deposition (ALD), plasma-enhanced ALD (PEALD), PVD, CVD, PECVD, or a combination thereof, followed by dry etching, not being limited thereto.

A purpose of forming the dummy gate structure 250' is to protect structural elements formed therebelow from various operations such as deposition and etching to form surrounding structures in subsequent steps of manufacturing a 3D-stacked semiconductor device. The dummy gate structure 250' may also serve to define dimensions of the channel layers 210 and 220 of each channel stack formed from the initial channel stack shown in FIG. 3A. The gate spacers 209 may be formed to isolate or protect the dummy gate structures 250' (and gate structures which will replace the dummy gate structures in later steps) from being oxidized in subsequent steps of manufacturing the 3D-stacked semiconductor device.

Referring to FIG. 3B, the initial channel stack may be patterned to form a 1$^{st}$ channel stack 20A and a 2$^{nd}$ channel stack 20B, between which a recess R1 penetrating into the substrate 201 from a top surface thereof is formed.

To pattern the initial channel stack to form the channel stacks 20A and 20B, hard mask patterns respectively formed on the initial dummy gate structures to obtain the dummy gate structures 250' may be used as a masking structure. To form the recess R1, dry etching such as reactive ion etching (RIE) may be performed on the initial channel stack based on the dummy gate structures 250 with the gate spacers 209 thereon as a masking structure.

The recess R1 may be formed to penetrate into the substrate from the top surface thereof to form a bottom recess R11 at least to provide an enough space for growing a 1$^{st}$ source/drain pattern in a later step from the 1$^{st}$ channel layers 210 including the lowermost 1$^{st}$ channel layer 210 and portions of gate structure to replace the lowermost 1$^{st}$ sacrificial layers 205 in each of the channel stacks 20A and 20B may be sure to be isolated from each other.

Due to the patterning operation on the initial channel stack in this step, the channel layers 210, 220, the sacrificial layers 205, 215, and the middle isolation layer 230 may be divided into respective elements forming the 1$^{st}$ channel stack 20A and the 2$^{nd}$ channel stack 20B. Further, in the recess R1, side surfaces of the bottom recess R11, the sacrificial layers 205, 215, the middle isolation layer 230, the channel layers 210, 220, and the gate spacer 209 of each channel stack may be vertically coplanar or aligned.

Figure 3D:
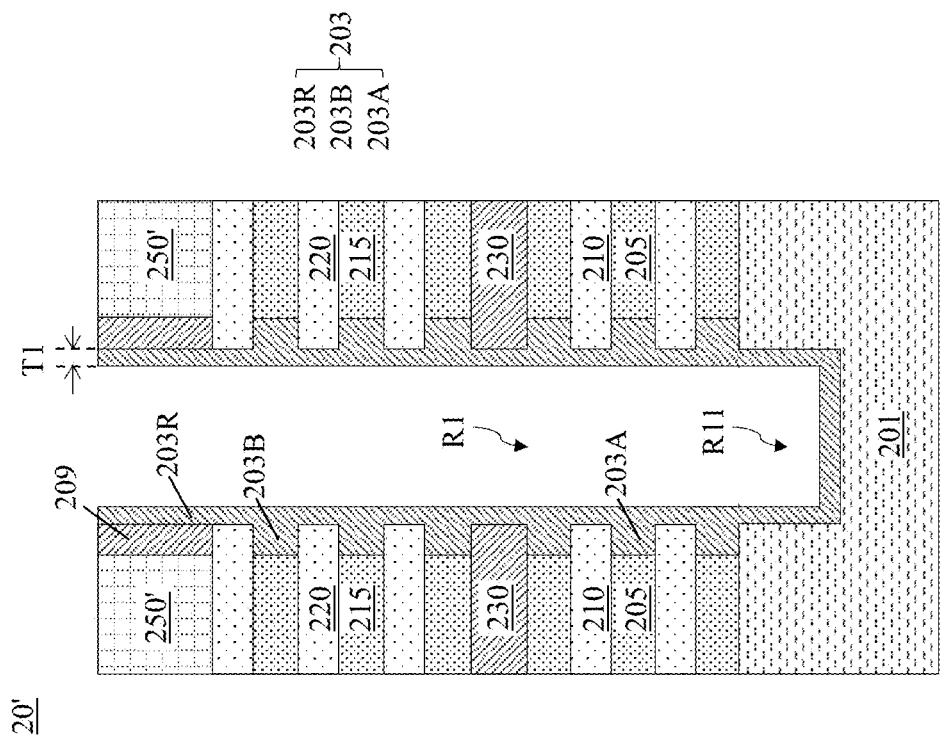
Figure 3C:
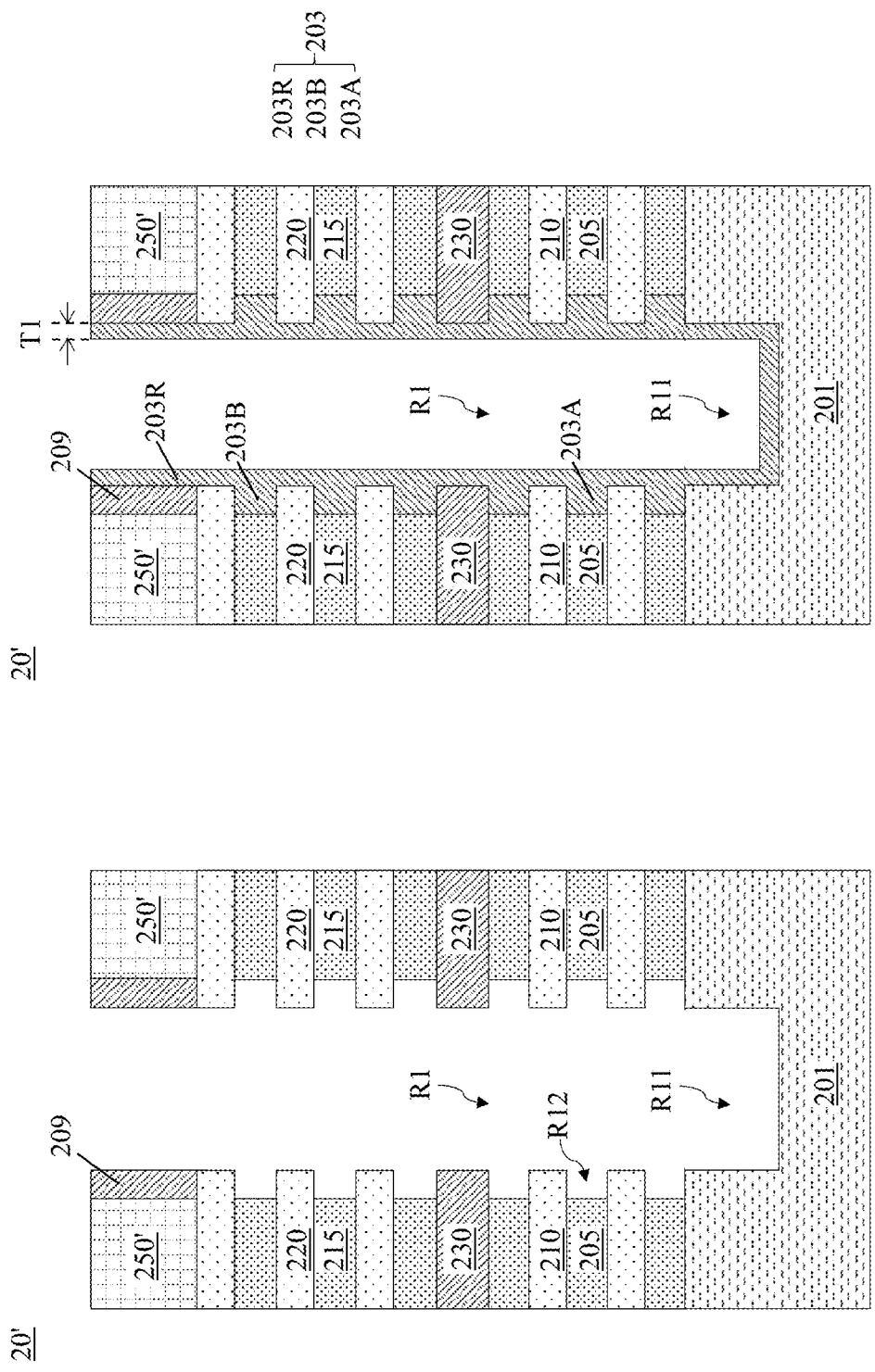

Referring to FIG. 3C, a selective patterning operation may be performed on side surfaces of the sacrificial layers 205 and 215 exposed to the recess R1 to pull back a portion of each of these layers based on the dummy gate structures 250' and the gate spacers 209 as masking structure, thereby forming a side recess R12 at each side surface of each of the sacrificial layers 205 and 215.

For the selective patterning operation in this step, dry etching or wet etching may be performed using an etchant, for example, chlorine/oxygen ($Cl_2/O_2$), a mixture of hydrofluoric acid (HF) and ammonium fluoride ($NH_4F$), not being limited thereto, which has a high etch selectivity of silicon germanium (SiGe) forming the sacrificial layers 205 and 215 against silicon (Si) forming the channel layers 210, 220 and silicon nitride or a composite thereof forming the middle isolation layers 230.

By the selective patterning operation in this step, the recess R1 between the two channel stacks 20A and 20B may also include the side recesses R12 in addition to the bottom recess R11.

Referring to FIG. 3D, an inner spacer layer 203 may be formed along a profile of the recess R1 including the bottom recess R2 and the side recesses R3.

The formation of the inner spacer layer 203 along the profile of the recess R1 including the side recesses R2 may be performed by depositing a dielectric material such as silicon nitride or a composite thereof (e.g., SiN, $Si_3N_4$, SiBCN, SiCN, SiOC, SiOCN, etc.) using, for example, ALD, followed by side planarization (e.g., chemical-mechanical polishing (CMP)), not being limited thereto.

The deposition of the inner spacer layer 203 may be performed such that the dielectric material is overfilled in the side recesses R12 and extended to side surfaces of the gate spacers 209, the channel layers 210, 220 and an inner surface of the bottom recess R2 in the substrate 201. Further, the side planarization may be performed such that the inner spacer layer 203 has a 1$^{st}$ thickness T1 from a side surface of the gate spacer 209 and a side surface of each of the channel layers 210 and 220 which are vertically aligned or coplanar, and further, the inner spacer layer 203 has the same 1$^{st}$ thickness T1 along an inner surface of the bottom recess R2 in the substrate 201. Thus, the inner spacer layer 203 of the intermediate semiconductor device 20' may include 1$^{st}$ inner spacers 203A formed in the side recesses R12 at the side surfaces of the 1$^{st}$ sacrificial layers 205, 2$^{nd}$ inner spacers 203A formed in the side recesses R12 at the side surfaces of the 2$^{nd}$ sacrificial layers 215, and an inner spacer residue 203R formed or remaining on the side surfaces of the gate spacers 209, the channel layers 210, 220, and the inner surface of the bottom recess R11 at the 1$^{st}$ thickness T1. After formation of the inner spacer layer 203 in the above manner, the inner spacer residue 203R of the inner spacer layer 203 may be connectedly formed along the profile of the recess R1 including the bottom recess R2 and the side recess R3, and a side surface of the inner spacer layer 203 exposed to the recess R1 may be plane, flat, or substantially plane or flat in a vertical direction.

Here, the inner spacer layer 203 may be formed by a single deposition operation, not being limited thereto, such that the dielectric material forming the inner spacer layer 203 may be connectedly formed along the profile of the recess R1 including the bottom recess R2 and the side recess R3. Thus, the inner spacers 203A, 203B and the inner spacer residue 203R may form a single continuum structure having no connection surface, interface or barrier therebetween.

Figure 3E:
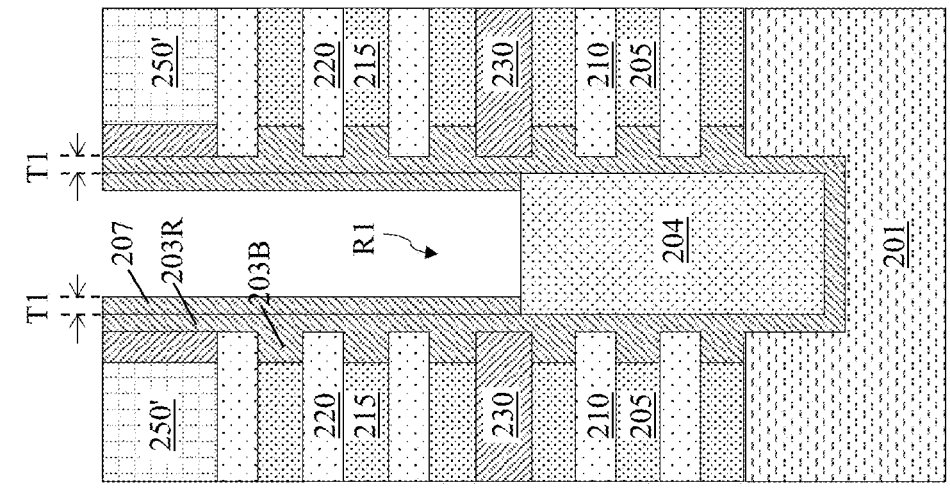

Referring to FIG. 3E, an inner isolation structure 204 may be formed in the recess R1 from a bottom surface to a predetermined level.

The inner isolation structure 204 may be formed through, for example, CVD, PVD, PECVD or a combination thereof, not being limited thereto, by depositing another dielectric material such as silicon oxide (e.g., $SiO_2$), not being limited thereto, having etch selectivity against silicon nitride or a composite thereof forming the inner spacer layer 203.

The inner isolation structure 204 may be formed in the recess R1 including the bottom recess R11 to a level above a top surface of the uppermost 1$^{st}$ sacrificial layer 205 and below a bottom surface of the lowermost 2$^{nd}$ sacrificial layer 215. Thus, a portion of the inner spacer layer 203 below the predetermined level in the recess R1 including the bottom recess R12 may be covered by the inner isolation structure 204, while the remaining portion of the inner spacer layer 203 above the predetermined level may be still exposed to the recess R1.

Figure 3F:
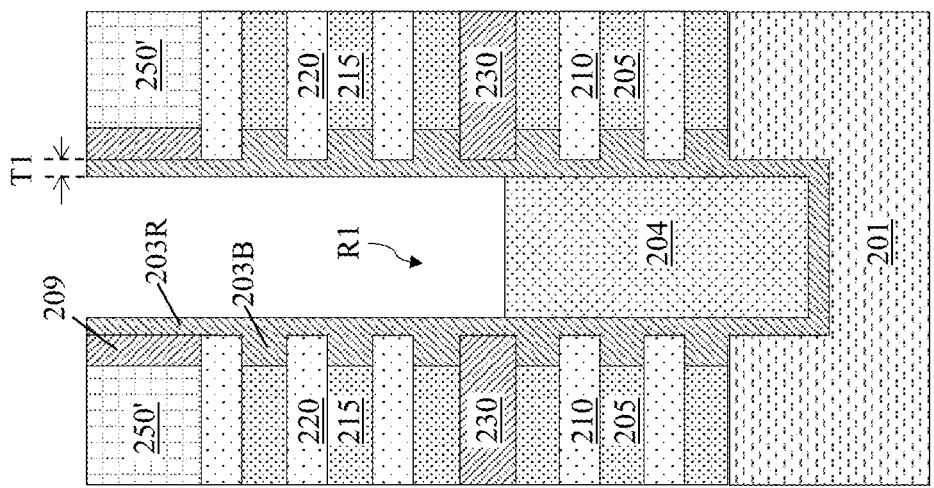

Referring to FIG. 3F, a 1$^{st}$ protection layer 207 may be conformally formed on side surfaces of the inner spacer layer 203 exposed to the recess R1 above the inner isolation structure 204.

The 1$^{st}$ protection layer 207 may be formed by depositing a dielectric material such as silicon nitride or a composite thereof (e.g., SiN, $Si_3N_4$, SiBCN, SiCN, SiOC, SiOCN, etc.) through, for example, ALD, not being limited thereto, along an inner surface of the recess R1, and removing a portion thereof on a top surface of the inner isolation structure 204. Thus, the side surfaces of the inner spacer layer 203 exposed to the recess R1 may be covered by the 1$^{st}$ protection layer 207, while at least a portion of the top surface of the inner isolation structure 204 is exposed in the recess R1. The dielectric material forming the 1$^{st}$ protection layer 207 may be the same as or different from the dielectric material forming the inner spacer layer 203.

The 1$^{st}$ protection layer 207 may be formed to have the same thickness T1 which is the thickness of the inner spacer residue 203R of the inner spacer layer 203. The 1$^{st}$ protection layer 207 may be used to protect an upper portion of the inner spacer layer 203 at least on the 2$^{nd}$ sacrificial layers 215 and the 2$^{nd}$ channel layers 220 when a lower portion of the inner spacer layer 203 at least on the 1$^{st}$ sacrificial layers 205 and the 1$^{st}$ channel layers 210 is removed to open the side surface of the 1$^{st}$ channel layers 210 from which a source/drain pattern is to be formed in later steps (FIGS. 3H-3I).

Figure 3G:
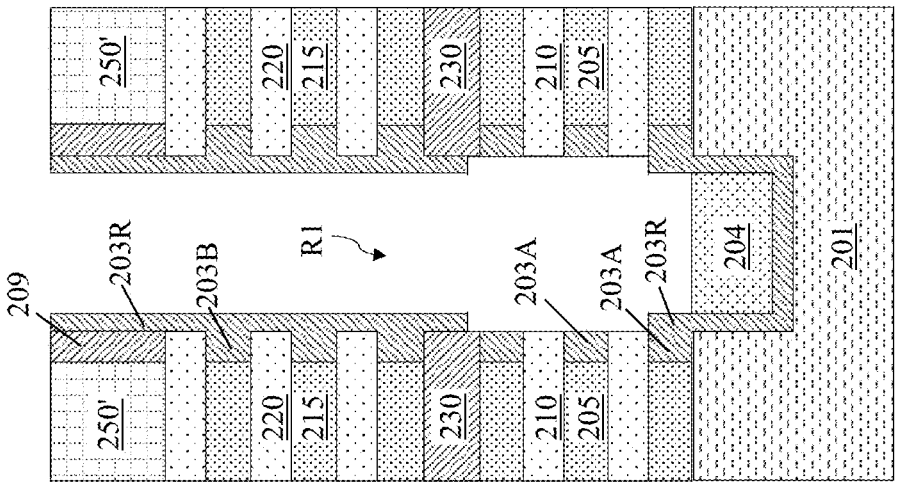
Figure 3H:
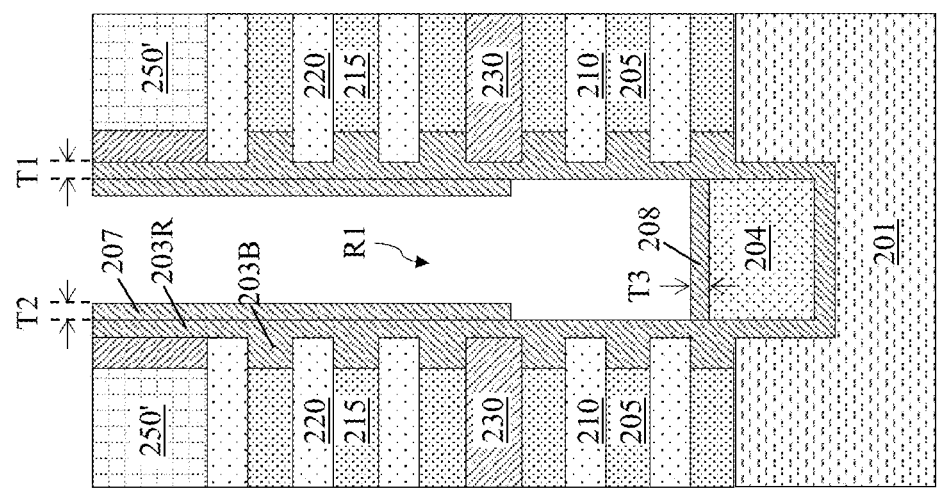
Figure 3I:
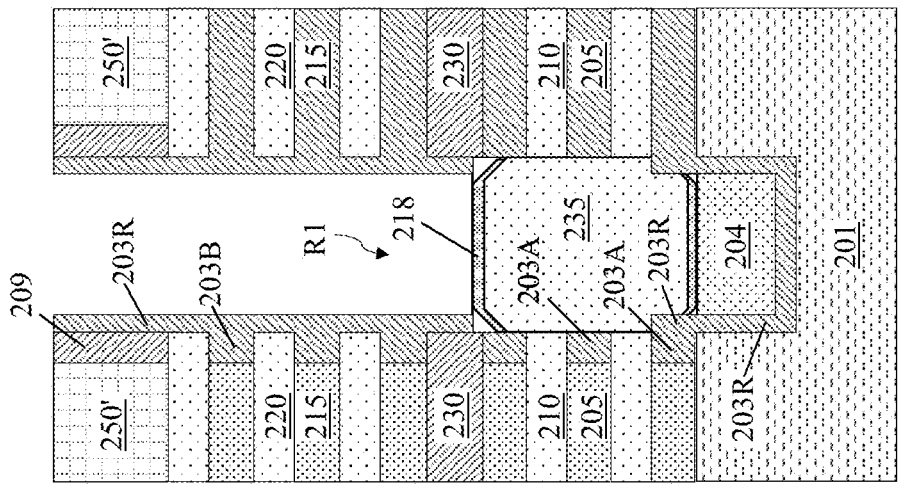

Referring to FIG. 3G, a portion of the inner isolation structure 204 may be removed from top, and a 2$^{nd}$ protection layer 208 may be formed on a top surface of the remaining inner isolation structure 204 in the recess R1.

The removal of a portion of the inner isolation structure 204 surrounded by the inner spacer layer 203 in the recess R1 may be performed through, for example, selective dry etching or wet etching using an etchant such as hydrofluoric acid (HF) or hot phosphoric acid ($H_3PO_4$) against silicon nitride or a composite thereof forming the inner spacer layer 203 and the $1^{st}$ protection layer 207.

The formation of the $2^{nd}$ protection layer 208 may be performed through, for example, deposition of silicon nitride or a composite thereof on the top surface of the remaining portion of the inner isolation structure 204 through, for example, ALD, not being limited thereto. Thus, the inner isolation structure 204 may now be in a form contained in the inner spacer residue 203R and the $2^{nd}$ protection layer 208. The $2^{nd}$ protection layer 208 may protect the inner isolation structure 204 from a subsequent etching operation on a portion of the inner spacer layer 203 to expose the side surface of the $1^{st}$ channel layers 210 in a next step (FIG. 3H). The $2^{nd}$ protection layer 208 may have a $3^{rd}$ thickness T3, which may be equal to the $1^{st}$ thickness T1 of the inner spacer residue 203R of the inner spacer layer 203 and the $2^{nd}$ thickness T2 of the $1^{st}$ protection layer 207.

Referring to FIG. 3H, the $1^{st}$ protection layer 207, a lower portion of the inner spacer layer 203 below a level of a bottom surface of the $1^{st}$ protection layer 207, and the $2^{nd}$ protection layer 208 may be removed to expose the $1^{st}$ inner spacers 203A at the side surfaces of the $1^{st}$ sacrificial layers 205 to the recess R1, and expose the side surfaces of the $1^{st}$ channel layers 210 and the top surface of the inner isolation structure 204 to the recess R1.

The removal operation in this step may be performed, for example, through dry etching such as RIE using plasma gases such as $CF_4$ and $CHF_3$ that selectively etches silicon nitride or a composite thereof. When this selective etching operation is performed on the $1^{st}$ protection layer 207 and the $2^{nd}$ protection layer 208 at the same time to remove the dielectric material by the same thickness T2 and T3, respectively, the inner spacer layer 203 exposed to the recess R1 below the $1^{st}$ protection layer 207 may also be etched by the same thickness T1, thereby exposing the $1^{st}$ inner spacers 203A on the side surfaces of the $1^{st}$ sacrificial layers 205 to the recess R1 and also exposing the side surfaces of the $1^{st}$ channel layers 210 and the top surface of the inner isolation structure 204 to the recess R1. At this time, when the $2^{nd}$ protection layer 208 is removed, a top portion of the inner isolation structure 204 may be removed due to a tight process margin, and thus, the top surface of the inner isolation structure 204 may be lowered compared to that prior to the removal operation in this step.

When the lower portion of the inner spacer layer 203 is removed along with the $1^{st}$ protection layer 207 to expose the side surfaces of the $1^{st}$ channel layers 210, the upper portion of the inner spacer layer 203 may remain on the side surfaces of the $2^{nd}$ channel layers 210. Thus, epitaxial growth of a source/drain pattern from the $2^{nd}$ channel layers can be prevented when this source/drain pattern is epitaxially grown from the $1^{st}$ channel layers 210 in a next step (FIG. 3I). Further, at this time, due to the $2^{nd}$ protection layer 208 having the $3^{rd}$ thickness T3, the inner spacer residue 203R may remain in the bottom recess R11 and on the side surface of the lowermost $1^{st}$ sacrificial layer 205 to form a thicker lowermost $1^{st}$ inner spacer 203A which is to isolate a source/drain pattern from a gate structure to replace the lowermost $1^{st}$ sacrificial layer 205 and the substrate 201.

Thus, the inner spacer residue 203R and the lowermost inner spacer 203A may form a single continuum structure that does not have a connection surface, interface or barrier therebetween.

Referring to FIG. 3I, a $1^{st}$ source/drain pattern 235 may be formed based on the $1^{st}$ channel layers 210 exposed to the recess R1 in the previous step (FIG. 3H).

The $1^{st}$ source/drain pattern 235 may be epitaxially grown from the $1^{st}$ channel layers 110 through, for example, molecular beam epitaxy (MBE), vapor-phase epitaxy (VPE), etc., not being limited thereto. The $1^{st}$ source/drain pattern 235 may be formed of silicon (Si) and may be doped in-situ with impurities such as phosphorus (P), arsenic (As), antimony (Sb), etc., so that the $1^{st}$ source/drain pattern 235 can be of an n-type. Alternatively, the $1^{st}$ source/drain pattern 235 may be formed of silicon germanium (SiGe) and may be doped in-situ with impurities such as boron (B), gallium (Ga), indium (In), etc., so that the $1^{st}$ source/drain pattern 235 can be of a p-type.

Figure 3J:
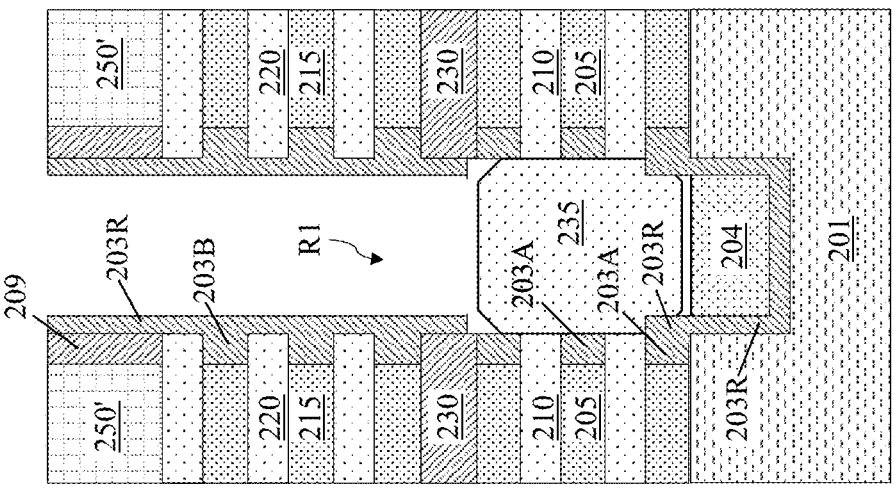

Referring to FIG. 3J, a passivation layer 218 may be formed on a top surface and a bottom surface of the $1^{st}$ source/drain pattern 235 to protect the $1^{st}$ source/drain pattern 235 from subsequent operations.

The passivation layer 218 may be formed through, for example, ALD of a material such as silicon nitride or a composite thereof (e.g., SiN, $Si_3N_4$, SiBCN, SiCN, SiOC, SiOCN, etc.), not being limited thereto. Alternatively, the passivation layer 218 may not be formed on the bottom surface of the $1^{st}$ source/drain pattern 235 when the $1^{st}$ source/drain pattern 235 is grown to contact the top surface of the inner isolation structure 204.

Referring to FIG. 3K, a front isolation structure 270 may be formed on a top surface of the $1^{st}$ source/drain pattern 235 with the passivation layer 218 thereon to isolate the $1^{st}$ source/drain pattern 235 from another source/drain pattern or other circuit elements.

The front isolation structure 270 may be formed through, for example, deposition a low-k dielectric material such as silicon oxide (e.g., $SiO_2$) using PVD, CVD, PECVD, etc., followed by planarization (e.g., CMP) on top, not being limited thereto. The front isolation structure 270 may be formed such that a top surface thereof is at a level below a bottom surface of the lowermost $2^{nd}$ channel layer 220 so that a portion of the inner spacer residue 203R on the side surface of the lowermost $2^{nd}$ channel layer 220 can be removed to expose the lowermost $2^{nd}$ channel layer 220 to the recess R1 for formation of a source/drain pattern in next steps (FIGS. 3M-3N).

Referring to FIG. 3L, the inner spacer residue 203R exposed to the recess R1 may be removed to expose the $2^{nd}$ channel layers 220 to the recess R1.

The removal of the inner spacer residue 203R may be performed through, for example, dry etching or side planarization (e.g., CMP), not being limited thereto, such that the side surfaces of the gate spacer 209, the $2^{nd}$ channel layers 220, and the $2^{nd}$ inner spacers 203B are exposed to the recess R1 and vertically coplanar or aligned.

Referring to FIG. 3M, a $2^{nd}$ source/drain pattern 245 may be formed based on the $2^{nd}$ channel layers 220 exposed to the recess R1 in the previous step (FIG. 3L), and the passivation layer 218 and the front isolation structure 270 may also be formed on the $2^{nd}$ source/drain pattern 245.

The $2^{nd}$ source/drain pattern 245 may be epitaxially grown from the $2^{nd}$ channel layers 110 through, for example, molecular beam epitaxy (MBE), vapor-phase epitaxy (VPE), etc., not being limited thereto. The $2^{nd}$ source/drain pattern 235 may be formed of silicon (SiGe) and may be doped in-situ with impurities such as boron (B), gallium (Ga), indium (In), etc., so that the $1^{st}$ source/drain pattern 235 can be of a p-type. Alternatively, the $2^{nd}$ source/drain pattern 235 may be formed of silicon (Si) and may be doped in-situ with impurities such as phosphorus (P), arsenic (As), antimony (Sb), etc., so that the $2^{nd}$ source/drain pattern 235 can be of an n-type.

The passivation layer 218 formed on the 1$^{st}$ source/drain pattern 235 may be formed again in the same manner on top and bottom surfaces of the 2$^{nd}$ source/drain pattern 245 to passivate the 2$^{nd}$ source/drain pattern 245 from subsequent operations including formation of the front isolation structure 270 thereon.

The front isolation structure 270 formed on the 1$^{st}$ source/drain pattern 235 may be formed in the same manner on the 2$^{nd}$ source/drain pattern 245 with the passivation layer 218 therebetween so that the 2$^{nd}$ source/drain pattern 245 can be isolated from other circuit elements including the 1$^{st}$ source/drain pattern 235.

Referring to FIG. 3N, the dummy gate structure 250' and the sacrificial layers 205 and 215 may be removed and replaced by a gate structure 250 to form the semiconductor device 20.

After the formation of the source/drain patterns 235 and 245, the dummy gate structure 250' and the sacrificial layers 205 and 215 may be removed through, for example, dry etching, wet etching, or a combination thereof, not being limited thereto, using an etchant, for example, as a mixture of nitric acid (HNO$_3$) and hydrofluoric acid (IF), not being limited thereto, to release the channel layers 210 and 220 forming the channel structures of the 3D-stacked semiconductor device 20, respectively.

Subsequently, spaces formed by the removal of the dummy gate structure 250' and the sacrificial layers 205 and 215 may be filled in with the gate structure 250 including a 1$^{st}$ inner gate structure 250A, a 2$^{nd}$ inner gate structure 25BA and an outer gate structure 250C through, for example, CVD, PVD, PECVD, or a combination thereof, not being limited thereto. The 1$^{st}$ inner gate structure 250A may surround the 1$^{st}$ channel layers 210, the 2$^{nd}$ inner gate structure 250B may surround the 2$^{nd}$ channel layers 220, and the outer gate structure 250C may be formed on the inner gate structures 250A and 250B.

Through the above-described steps, the 3D-stacked semiconductor device 20 may be formed to have an improved bottom isolation structure which includes the inner spacer residue 203R and the inner isolation structure 204 thereon to isolate the 1$^{st}$ source/drain pattern 235 and the substrate 201.

Figure 4:
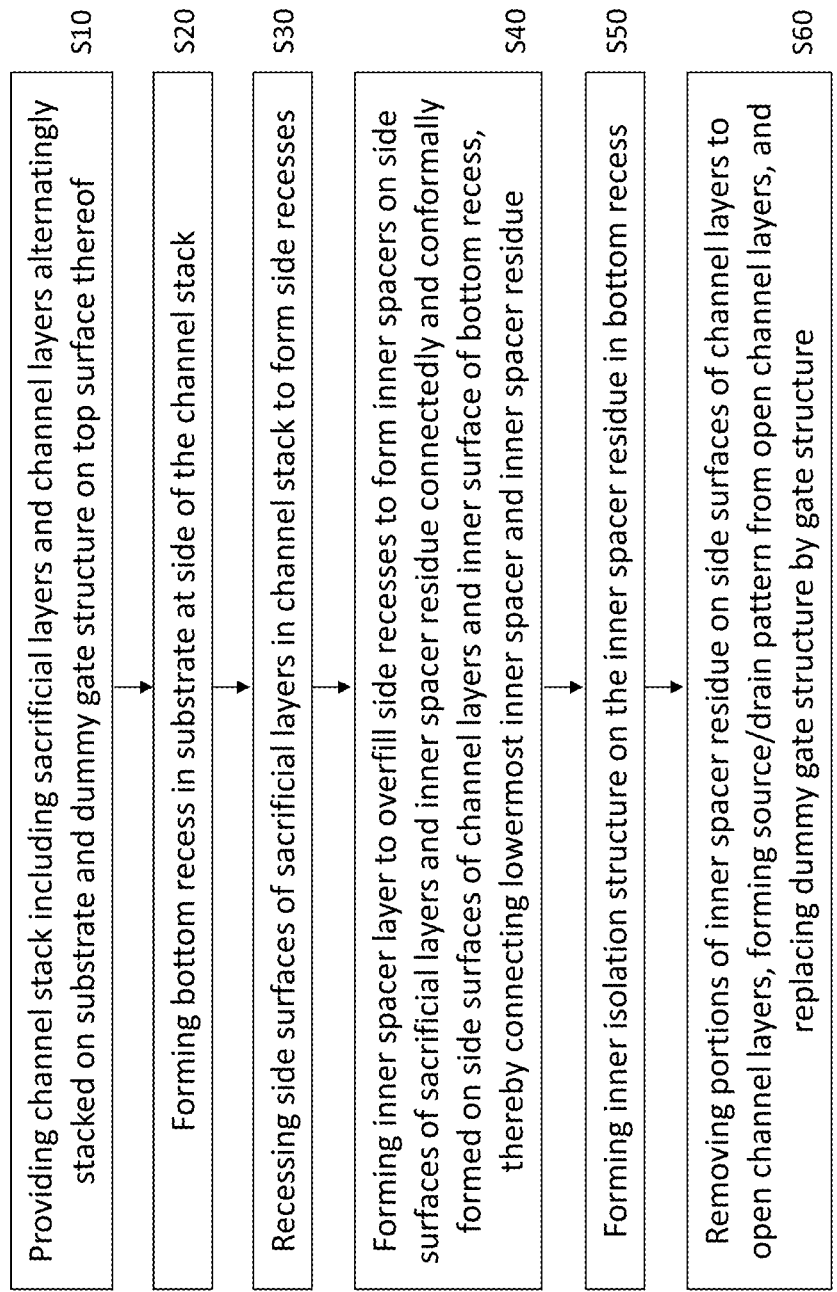
FIG. 4 illustrates a flowchart of a method of manufacturing a semiconductor device including a bottom isolation structure formed of at least two different layers in reference to FIGS. 3A-3N, according to one or more other embodiments.

FIG. 4 illustrates a flowchart of a method of manufacturing a semiconductor device including a bottom isolation structure formed of at least two different layers in reference to FIGS. 3A-3N, according to one or more other embodiments.

The semiconductor device manufactured according to the flowchart of FIG. 4 may be the same as or correspond to the 3D-stacked semiconductor device 20 shown in FIG. 2, and operations performed for each step of manufacturing the 3D-stacked semiconductor device may be the same as or similar to those described above in reference to FIGS. 3A-3M. Thus, duplicate descriptions may be omitted herein.

In step S10, a channel stack including a plurality of sacrificial layers and channel layers which are alternatingly stacked on a substrate is provided (FIG. 3A). The channel stack may be one of a plurality of channel stacks patterned from an initial channel stack, and a dummy gate structure may be formed on the channel structure.

In step S20, a bottom recess may be formed in the substrate at a side of the channel stack (FIG. 3B). The bottom recess may be formed such that patterning the initial channel stack to form a recess which penetrates into the substrate between two adjacent channel stacks to include the bottom recess in the substrate.

In step S30, side surfaces of the sacrificial layers in the channel stack may be recessed to form side recesses (FIG. 3C). The side surface of the sacrificial layers exposed to the recess may be selectively etched against the channel layers to form the side recesses.

In step S40, an inner spacer layer may be formed to overfill the side recesses to form inner spacers on the side surfaces of the sacrificial layers and an inner spacer residue which is connectedly and conformally formed on side surfaces of the channel layers and an inner surface of the bottom recess, thereby connecting the lowermost inner spacer and the inner spacer residue (FIG. 3D). Here, the inner spacer layer may be formed along a profile of the recess including the bottom recess and the side recesses between the two adjacent channel stacks.

In step S50, an inner isolation structure may be formed on the inner spacer residue in the bottom recess (FIGS. 3E-3G). The inner isolation structure may have a different material composition from that of the inner spacer layer.

In step S60, portions of the inner spacer residue on the side surfaces of the channel layers may be removed to open the channel layers, and a source/drain pattern may be formed from the open channel layers. Further, the dummy gate structure may be replaced by a gate structure (FIGS. 3H-3M). Due to the inner spacer residue and the inner isolation structure thereon, the source/drain pattern may be more effectively isolated from the substrate.

Through the above method and steps, a semiconductor device having an improved isolation performance between a source/drain pattern and a substrate may be provided.

FIG. 5 is a schematic block diagram illustrating an electronic device including a semiconductor device including a bottom isolation structure formed of at least two different layers, according to one or more embodiments. This semiconductor device may be or correspond to the 3D-stacked semiconductor device 20 shown in FIG. 2.

Referring to FIG. 5, an SoC 1000 may be an integrated circuit in which components of a computing system or other electronic systems are integrated. As an example of the SoC 1000, an application processor (AP) may include at least one processor and components for various functions. The SoC 1000 may include a core 1011 (e.g., a processor), a digital signal processor (DSP) 1012, a graphic processing unit (GPU) 1013, an embedded memory 1014, a communication interface 1015, and a memory interface 1016. The components of the SoC 1000 may communicate with each other through a bus 1007.

The core 1011 may process instructions and control operations of the components included in the SoC 1000. For example, the core 1011 may process a series of instructions to run an operating system and execute applications on the operating system. The DSP 1012 may generate useful data by processing digital signals (e.g., a digital signal provided from the communication interface 1015). The GPU 1013 may generate data for an image output by a display device from image data provided from the embedded memory 1014 or the memory interface 1016, or may encode the image data.

The embedded memory 1014 may store data necessary for the core 1011, the DSP 1012, and the GPU 1013 to operate. The communication interface 1015 may provide an interface for a communication network or one-to-one communication. The memory interface 1016 may provide an interface for an external memory of the SoC 1000, such as a dynamic random access memory (RAM) (DRAM), a flash memory, etc.

At least one of the core 1011, the DSP 1012, the GPU 1013, and/or the embedded memory 1014 may include the 3D-stacked semiconductor device 20 shown in FIG. 2.

The foregoing is illustrative of example embodiments and is not to be construed as limiting the disclosure. Although a few example embodiments have been described, those skilled in the art will readily appreciate that many modifications are possible in the above embodiments without materially departing from the disclosure.

What is claimed is:

1. A semiconductor device comprising:
   a substrate;
   a channel structure on the substrate;
   a source/drain pattern connected to the channel structure;
   a gate structure on the channel structure;
   an inner spacer structure comprising an inner spacer between the source/drain pattern and the gate structure, and an inner spacer residue connected to the inner spacer structure; and
   an inner isolation structure between the inner spacer residue and a bottom surface of the source/drain pattern,
   wherein the inner spacer residue extends into the substrate, and
   wherein the inner spacer and the inner spacer residue are connected without a connection surface therebetween.

2. The semiconductor device of claim 1, wherein the inner spacer and the inner spacer residue comprise a same material composition.

3. The semiconductor device of claim 1, wherein the inner spacer residue and the inner isolation structure have different material compositions.

4. The semiconductor device of claim 1, wherein the inner spacer residue comprises silicon nitride or a composite thereof, and the inner isolation structure comprises silicon oxide.

5. The semiconductor device of claim 1, wherein the inner isolation structure is enclosed by the inner spacer residue and the bottom surface of the source/drain pattern.

6. The semiconductor device of claim 1, wherein the channel structure comprises a plurality of channel layers extended in a $1^{st}$ direction and arranged in a $2^{nd}$ direction on the substrate, the $1^{st}$ direction intersecting the $2^{nd}$ direction,
   wherein the inner spacer structure comprises a plurality of inner spacers arranged in the $2^{nd}$ direction,
   wherein the inner spacer connected to the inner spacer residue is the lowermost inner spacer among the plurality of inner spacers, and
   wherein the inner spacer is connected to the inner spacer residue without a connection surface therebetween.

7. The semiconductor device of claim 1, wherein a bottom portion of the inner spacer residue is formed on a bottom surface of a bottom recess in the substrate below the source/drain pattern, and
   wherein the inner isolation structure is between the bottom portion of the inner spacer residue and the bottom surface of the source/drain pattern.

8. The semiconductor device of claim 1, wherein the inner spacer residue is formed along an inner surface of a bottom recess formed in the substrate below the source/drain pattern and extended to a side surface of the inner spacer.

9. The semiconductor device of claim 1, wherein the substrate and the source/drain pattern are isolated by the inner spacer residue and the inner isolation structure.

10. A semiconductor device comprising:
    a substrate;
    a $1^{st}$ channel structure and a $2^{nd}$ channel structure at a side of the $1^{st}$ channel structure, on the substrate;
    a source/drain pattern between the $1^{st}$ channel structure and the $2^{nd}$ channel structure;
    a $1^{st}$ gate structure on the $1^{st}$ channel structure, and a $2^{nd}$ gate structure on the $2^{nd}$ channel structure;
    a $1^{st}$ inner spacer between the source/drain pattern and the $1^{st}$ gate structure, and a $2^{nd}$ inner spacer between the source/drain pattern and the $2^{nd}$ gate structure; and
    an inner spacer residue directly connecting the $1^{st}$ inner spacer and the $2^{nd}$ inner spacer in the substrate below the source/drain pattern.

11. The semiconductor device of claim 10, wherein the $1^{st}$ inner spacer, the inner spacer residue, and the $2^{nd}$ inner spacer are connected without a connection surface therebetween.

12. The semiconductor device of claim 10, wherein the $1^{st}$ inner spacer, the inner spacer residue, and the $2^{nd}$ inner spacer isolate the source/drain pattern from the substrate.

13. A semiconductor device comprising:
    a substrate;
    a $1^{st}$ channel structure and a $2^{nd}$ channel structure at a side of the $1^{st}$ channel structure, on the substrate;
    a source/drain pattern between the $1^{st}$ channel structure and the $2^{nd}$ channel structure;
    a $1^4$ gate structure on the $1^{st}$ channel structure, and a $2^{nd}$ gate structure on the $2^{nd}$ channel structure;
    a $1^{st}$ inner spacer between the source/drain pattern and the $1^{st}$ gate structure, and a $2^{nd}$ inner spacer between the source/drain pattern and the $2^{nd}$ gate structure;
    an inner spacer residue connecting the $1^{st}$ inner spacer and the $2^{nd}$ inner spacer; and
    an inner isolation structure between a bottom surface of the source/drain pattern and a combination of the $1^{st}$ inner spacer, the inner spacer residue and the $2^{nd}$ inner spacer, in the substrate,
    wherein the $1^{st}$ inner spacer is connected to the $2^{nd}$ inner spacer through the inner spacer residue in the substrate below the source/drain pattern.

14. The semiconductor device of claim 13, wherein the inner isolation structure and the inner spacer residue have different material compositions.

15. The semiconductor device of claim 10, wherein the inner spacer residue is formed along an inner surface of a bottom recess formed in the substrate below the source/drain pattern and extended to a side surface of each of the $1^{st}$ inner spacer and the $2^{nd}$ inner spacer.

* * * * *